United States Patent [19]

Fukuba

[11] Patent Number: 5,451,488
[45] Date of Patent: Sep. 19, 1995

[54] RETICLE HAVING SUB-PATTERNS AND A METHOD OF EXPOSURE USING THE SAME

[75] Inventor: Nobuyuki Fukuba, Nara, Japan

[73] Assignee: Sharp Kabushiki Kaisha, Osaka, Japan

[21] Appl. No.: 134,043

[22] Filed: Oct. 8, 1993

[30] Foreign Application Priority Data

Oct. 13, 1992 [JP] Japan ............................ 273913

[51] Int. Cl.⁶ ............................................... G03C 5/00
[52] U.S. Cl. ............................... 430/312; 430/311; 430/394; 430/5
[58] Field of Search ................. 430/5, 311, 312, 394

[56] References Cited

FOREIGN PATENT DOCUMENTS 0055620 7/1982 European Pat. Off. .
0328410 8/1989 European Pat. Off. .
0133546 7/1984 Japan .
2-84742 3/1990 Japan .
4-162670 6/1992 Japan .

Primary Examiner—S. Rosasco
Attorney, Agent, or Firm—David G. Conlin; Peter F. Corless

[57] ABSTRACT

A method for producing a semiconductor device, includes the steps of: exposing a substrate using a first photomask to form a first chip pattern on the substrate, the first chip pattern being divided into first sub-patterns at a first position on the first photomask so that the first sub-patterns are combined on the substrate and form the first chip pattern; exposing the substrate using a second photomask to form a second chip patterns on the substrate, the second chip pattern being divided into second sub-patterns at a second position on the second photomask so that the second sub-patterns are combined on the substrate and form the second chip pattern; and wherein the second position on the second photomask is different relative to the first position on the first photomask.

8 Claims, 6 Drawing Sheets

RETICLE HAVING SUB-PATTERNS AND A METHOD OF EXPOSURE USING THE SAME

BACKGROUND OF THE INVENTION

1. Field of the Invention

The present invention relates to photomasks such as reticles and a method for producing a semiconductor device using photomasks.

2. Description of the Related Art

Photolithography is well known as a technique used in the fabrication of semiconductor devices to transfer a desired pattern onto a semiconductor substrate. The desired pattern is formed initially on the photomask, and an image of the desired pattern is transferred onto a surface of the semiconductor substrate by exposing the semiconductor substrate in combination with the photomask. Typically, fabrication of semiconductor devices requires a set of photomasks, or mask layers each photomask having a different pattern to be utilized to form a different layer on the semiconductor substrate. In the case where a step-and-repeat camera, which is a kind of projection camera, is utilized as an exposure apparatus, the pattern formed on the photomask is transferred to the semiconductor substrate in a step-and-repeat fashion. The pattern on the photomask itself is sometimes over-sized and is optically reduced when formed on the semiconductor substrate. Such a photomask is often referred to as a reticle.

As an example of a photolithographic process, the production of a solid state imaging device is explained in detail. FIG. 1 shows, in part, two patterns which are formed on a semiconductor substrate 101 in two different steps of fabrication. In FIG. 1, a channel stop pattern 103 and a shield metal pattern 104 (shown with cross-hatching) overlapping the channel stop pattern 103 are shown. The channel stop pattern 103 defines a region for isolating a plurality of pixels in the solid state imaging device. The shield metal pattern 104 defines a plurality of windows 104' corresponding to pixels through which light penetrates. The channel stop pattern 103 and the shield metal pattern 104 are formed on a region 105 of the semiconductor substrate 101 defining an area of one chip of the solid state imaging device. The chip has a length 1. The semiconductor substrate 101 may include a plurality of identical chips as shown in part.

In order to form the channel stop pattern 103 or the shield metal pattern 104 on the semiconductor substrate 101, a respective pattern which is five times (5×) as large, for example, as the channel stop pattern 103 or the shield metal pattern 104 is formed on a reticle. In the event the solid state imaging device being produced has a substantially long length 1, however, the pattern to form the channel stop pattern 103 or the shield metal pattern 104 may be too large to be formed as a single continuous pattern on the reticle. For example, if the solid state imaging device has the length 1 equal to 20 mm, the 5× reticle must be able to accommodate thereon a pattern having the length equal to 100 mm. However, the reticle may not have an available area long enough to accommodate such a large pattern thereon.

In such case, each pattern utilized in forming each corresponding layer is divided into a plurality of separate, non-continuous portions. These portions, referred to herein as sub-patterns, are combined on the substrate to fabricate one chip. As is shown in FIG. 1, the channel stop pattern 103 is divided into sub-patterns 103A, 103B, and 103C at positions 106 and 107. The shield metal pattern 104 is divided into sub-patterns 104A, 104B, and 104C, also at positions 106 and 107. The channel stop pattern 103 and the shield metal pattern 104 are divided at the same positions as is conventional because of ease in designing the patterns, manufacturing the reticles, and checking misalignment of the sub-patterns.

FIG. 2 schematically shows an arrangement of the sub-patterns of the channel stop pattern 103 on the reticle 102. It is noted that although the reticle 102 has a pattern which is five times as large as the channel stop pattern 103, the reticle 102 is referred to herein simply as including the channel stop pattern 103 for clarity. It will be appreciated that other orders of reduction can be utilized without departing from the scope of the invention.

The reticle 102 has composite mask patterns 108 and 109 thereon. The composite mask pattern 108 consists of the pattern in which two sub-patterns 103A and two sub-patterns 103C are each arranged adjacently in a y-axis direction. The composite mask pattern 109 consists of two sub-patterns 103B arranged in the y-axis direction. Overlap patterns 111A, 111B, and 111C are formed adjacent to the sub-patterns 103A, 103B, and 103C, respectively. The overlap patterns 111A, 111B, and 111C provide a degree of overlap between the respective sub-patterns to provide better continuity in the channel stop pattern 103 when the sub-patterns 103A, 103B, and 103C are combined to form the complete channel stop pattern 103. Each of the sub-patterns 103A, 103B, and 103C is isolated by scribe regions 110. A border region 116 separates the composite mask patterns 108 and 109. The sub-patterns 104A, 104B, and 104C are arranged on another reticle 102 in the same way as are sub-patterns 103A, 103B, and 103C in FIG. 2, except that the sub-patterns 104A, 104B, and 104C appear in place of the sub-patterns 103A, 103B, and 103C, respectively.

In order to expose the semiconductor substrate 101 using the appropriate reticle 102 for each respective layer, a step-and-repeat camera, commonly referred to as a stepper, is utilized. The stepper has an offset means for changing projection coordinates, blind means for shielding a part of the reticle, and step-and-repeat means for exposing a substrate in step-and-repeat fashion.

FIG. 3A schematically shows a channel stop pattern 103 formed on the semiconductor substrate 101 using the sub-patterns 103A, 103B, and 103C. Referring to FIGS. 2 and 3A, the method of forming the channel stop pattern 103 on the semiconductor substrate 101 using the corresponding reticle 102 of FIG. 2 and the stepper is now explained. The semiconductor substrate 101 is exposed using the reticle 102 whereby the composite mask pattern 109 is shielded using the blind means of the stepper, and the sub-patterns 103C and 103A are irradiated and thereby transferred on the semiconductors substrate 101.

Then, the projection coordinates are moved using the offset means, and the semiconductor substrate 101 is exposed using the reticle 102 of FIG. 2 in which the composite mask pattern 108 is shielded, so that the sub-pattern 103B is formed between the sub-patterns 103A and 103C previously formed on the semiconductor substrate 101. The overlap patterns 111A and 111B overlap with parts of the sub-patterns 103B and 103A, respectively. A border 112 is formed between an edge of the sub-pattern 103A and an edge of the sub-pattern 103B. The border 112 is disposed at the position 106 shown in FIG. 1. The overlap patterns 111B and 111C also overlap with parts of the sub-patterns 103C and 103B, respectively. A border 113 is formed between the other edge of the sub-pattern 103B and an edge of the sub-pattern 103C. The border 113 is disposed at the position 107 shown in FIG. 1. As a result, the channel stop pattern 103 consisting of the sub-patterns 103A, 103B, and 103C is formed on the semiconductor substrate 101.

As previously mentioned, the shield metal pattern 104 is also divided into the sub-patterns 104A, 104B, and 104C. The sub-patterns 104A, 104B, and 104C are disposed on another reticle (not shown) in the same manner as the sub-patterns 103A, 103B, and 103C for the channel stop pattern 103. As is shown in FIG. 3B, the shield metal pattern 104 consisting of the sub-patterns 104A, 104B, and 104C is formed as a layer on the semiconductor substrate 101 on top of the channel stop pattern with resultant borders 112 and 113 at positions 106 and 107 (FIG. 1), respectively.

Accordingly, the aforementioned method results in each layers on the chip including the borders 112 and 113. FIG. 4 represents an enlarged view near an exemplary border 112 in an actual device. FIG. 5, in comparison, shows an enlarged view near the border 112 according to an ideal device. As is shown in FIG. 4, because transferring the sub-patterns 103A and 103B needs different alignments of the reticle in relation to the semiconductor substrate 101, a relative misalignment between the sub-pattern 103B and the sub-pattern 103A has arisen. In particular, the sub-pattern 103B is misaligned in both the x-axis and y-axis directions relative to the sub-pattern 103A at the border 112. The sub-pattern 104B also is misaligned relative to the sub-pattern 104A at the border 112. Moreover, the pattern width m of the sub-pattern 104A may be different from the pattern width n of the sub-pattern 104B because of lens distortion in the stepper.

Each light receiving portion of the solid state imaging device has an area defined by the channel stop pattern 103 and the shield metal pattern 104. Because of the misalignments mentioned above, however, a light receiving portion 114, for example, has a different area from that of a light receiving portion 115. The difference in the area in the light receiving portions degrades the uniformity characteristics of the device as will be appreciated. Specifically, the light detecting sensitivity, saturation voltage, and the like become disproportionate between the light receiving portions 114 and 115, for example.

In FIG. 4, it is shown that the sub-patterns 103A and 103B of the channel stop pattern 103 and the sub-patterns 104A and 104B of the shield metal pattern 104 misalign at the same border 112. However, it will be appreciated that the sub-patterns of all layers in the solid state imaging device, including those other than the channel stop pattern 103 and the shield metal pattern 104, may misalign at the same border 112. The misalignment of each of these layers is accumulated at the border 112, and device characteristics of the light receiving portion 115 are even more different from those of the light receiving portion 114 on the other side of the border.

As is explained above, according to a conventional method for producing a semiconductor device, each misalignment occurs at the same position, that makes the non-uniformity of the device characteristics in one chip increasing. The lens distortion in the stepper causes deformation of desired patterns to be formed on the semiconductor substrate, that also degrades the uniformity of the device characteristics. The present invention can solve the aforementioned shortcomings associated with the conventional method of producing a semiconductor device and provide a method of producing the semiconductor device having uniform device characteristics.

SUMMARY OF THE INVENTION

The method for producing a semiconductor device of this invention, includes the steps of: exposing a substrate using a first photomask to form a first chip pattern on the substrate, the first chip pattern being divided into first sub-patterns at a first position on the first photomask so that the first sub-patterns are combined on the substrate and form the first chip pattern; exposing the substrate using a second photomask to form a second chip pattern on the substrate, the second chip pattern being divided into second sub-patterns at a second position on the second photomask so that the second sub-pattern are combined on the substrate and form the second chip pattern; and wherein the second position on the second photomask is different relative to the first position on the first photomask.

In another aspect of the invention, a semiconductor device having first and second chip patterns formed on a substrate is provided. The semiconductor device is produced according to the steps of: forming the first chip pattern on the first substrate by sequentially forming a plurality of first sub-patterns making up the first chip pattern on the substrate, the first sub-patterns being joined together on the substrate at at least one first border; forming the second chip pattern overlapping the first chip pattern on the substrate by sequentially forming a plurality of second sub-patterns making up the second chip pattern on the substrate, the second sub-patterns being joined together on the substrate at at least one second border; and wherein a location of each of the at least one first border on the substrate is different than a location of each of the at least one second border on the substrate.

In another aspect of the invention, a semiconductor device having first and second chip patterns formed on a substrate is provided. The semiconductor device is produced according to the steps of: forming the first chip pattern on the first substrate by sequentially forming a plurality of first sub-patterns making up the first chip pattern on the substrate, the first sub-patterns being joined together on the substrate at at least one first border; forming the second chip pattern overlapping the first chip pattern on the substrate by sequentially forming a plurality of second sub-patterns making up the second chip pattern on the substrate, the second sub-patterns being joined together on the substrate at at least one second border; and wherein a location of each of the at least one first border on the substrate is different than a location of the or of the at least one second border on the substrate.

In another aspect of the invention, a photomask set for use in producing a semiconductor device, includes: a first photomask having a first chip pattern, the first chip pattern being divided into first sub-patterns at a first position, for forming the first chip pattern on the substrate by exposing the substrate using each of the sub-patterns sequentially; and a second photomask having a second chip pattern, the second chip pattern being divided into second sub-patterns at a different position from the first position, for forming the second chip pattern on the substrate by exposing the substrate using each of the sub-patterns sequentially.

Thus, the invention described herein makes possible the advantages of (1) providing a method for producing a semiconductor device having good device uniformity characteristics with high production yield and (2) providing a photomask set which enables production of a large size device.

These and other advantages of the present invention will become apparent to those skilled in the art upon reading and understanding the following detailed description with reference to the accompanying figures.

DESCRIPTION OF THE PREFERRED EMBODIMENTS

The present invention will now be described in connection with the production of one dimensional solid state imaging devices. However, it will be appreciated that the present invention can be utilized in the production of a wide variety of different types of semiconductor devices, and is not limited necessarily to solid state imaging devices.

Figure 6:
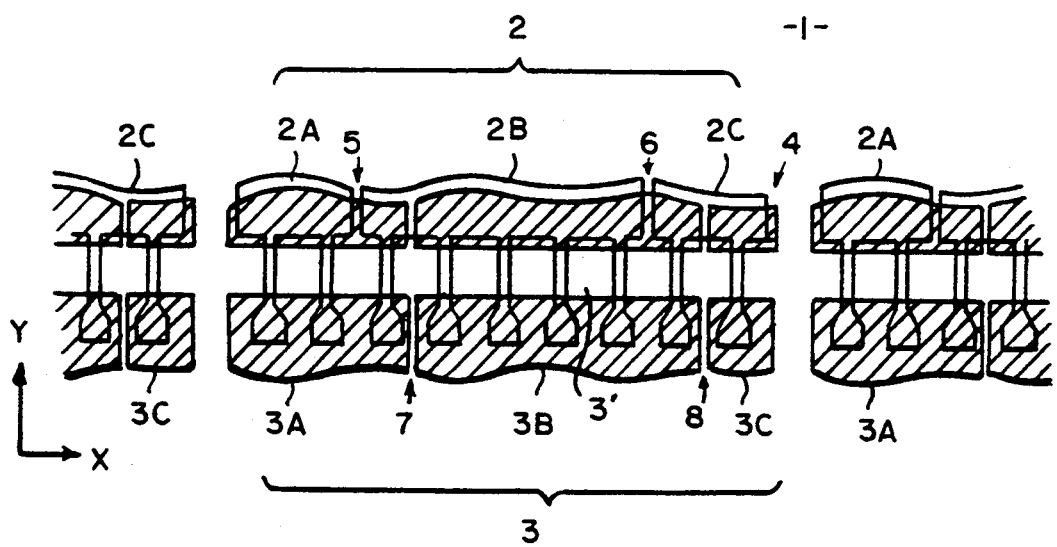
FIG. 6 schematically shows a division of a channel stop pattern and a shield metal pattern according to the present invention.

FIG. 6 shows, in part, two patterns or layers which are formed on the semiconductor substrate 1 in different steps of fabrication. In FIG. 6, a channel stop pattern 2 is a first chip pattern and a shield metal pattern 3 is a second chip pattern which overlaps the channel stop pattern 2 as is shown. The channel stop pattern 2 defines a region for isolating a plurality of pixels of the one dimensional solid state imaging device. The shield metal pattern 3 defines a plurality of windows 3' corresponding to respective pixels through which light penetrates. The channel stop pattern 2 and the shield metal pattern 3 are formed on a region 4 of the substrate 1 defining an area for one complete chip of the solid state imaging device. Thus, each channel stop pattern 2 and shield metal pattern 3 represents a chip pattern for forming a respective layer in a complete one dimensional solid state imaging device. As will be appreciated, the semiconductor substrate 1 may include multiple chips formed during the production stages, the chips ultimately being separated, and packaged.

As is shown in FIG. 6, the channel stop pattern 2 is divided into sub-patterns 2A, 2B, and 2C at first positions 5 and 6 relative to the x-axis. The shield metal pattern 3 is also divided into sub-patterns 3A, 3B, and 3C, except at second positions 7 and 8 relative to the x-axis. The first positions 5 and 6 are different or otherwise offset from the second positions 7 and 8, respectively, relative to the x-axis. Thus, the channel stop pattern 2 and the shield metal pattern 3 are divided at different respective positions as shown.

Figures 7A, 7B:
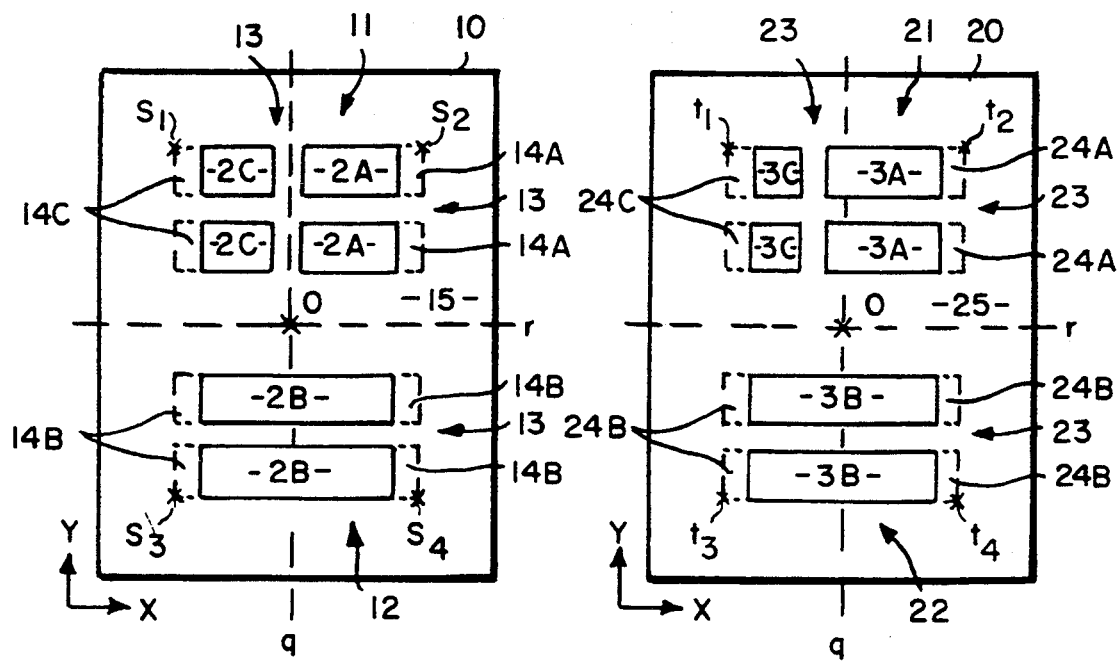
FIG. 7A is a plan view of a reticle having divided channel stop sub-patterns according to the present invention.
FIG. 7B is a plan view of a reticle having divided shield metal sub-patterns according to the present invention.

FIG. 7A schematically shows an arrangement of the sub-patterns 2A, 2B, and 2C on a reticle 10 according to the present invention. The reticle 10 has composite mask patterns 11 and 12 thereon. The composite mask pattern 11 consists of two sub-patterns 2A and two sub-patterns 2C each arranged adjacently relative to the y-axis. The sub-patterns 2A and 2C are disposed in the x-axis direction, respectively. The composite mask pattern 12 consists of the patterns in which two sub-patterns 2B are arranged adjacently to one another in the y-axis direction.

The pattern on the reticle 10 is preferably enlarged, e.g., 5×, such that the pattern on the reticle is five times as large as the channel stop pattern 2 will actually be when reproduced on the semiconductor substrate. The reduction optics used during the photolithographic process will reduce the size of the pattern on the semiconductor substrate as will be appreciated.

The reticle 10 includes overlap patterns 14A, 14B, and 14C which are formed adjacently to each of the sub-patterns 2A, 2B, and 2C, respectively. The overlap patterns 14A, 14B, and 14C provide better continuity again in the channel stop pattern 2 when the sub-patterns 2A, 2B, and 2C are combined to form the complete channel stop pattern 2. Each of the sub-patterns 2A, 2B, and 2C is isolated by a scribe region 13. A border region 15 surrounds the composite mask patterns 11 and 12. The border region 15 is formed to shield light.

When the substrate 1 is exposed in combination with the reticle 10 using a stepper (step-and-repeat camera), the sub-patterns 2A, 2B, and 2C formed on the substrate 1 may be distorted because of the lens distortion occurring within the stepper. Distortion of the sub-patterns 2A, 2B, and 2C caused by the lens distortion is proportional to the distance of the sub-patterns 2A, 2B, and 2C from the center light axis of the stepper, i.e., coincident with the center o of the reticle 10. As is known, the peripheral portions of the reticle 10 are more affected by the lens distortion.

Therefore, it is preferable that the composite mask patterns 11 and 12 are disposed as near to the center o of the reticle 10 as possible. Specifically, the distance between the center o and each of corner points $s_1$, $s_2$, $s_3$, and $s_4$ is preferably substantially equal to each other. Each of the corner points $s_1$, $s_2$, $s_3$, and $s_4$ is defined as the point which is nearest to a respective corner of the reticle 10 in the composite mask patterns 11 and 12. By making the distance between the center o and each of corner points sl, s2, s3, and s4 equal to each other, the pattern consisting of the composite mask patterns 11 and 12 is disposed substantially symmetrically relative to a vertical center axis q and a horizontal center axis r.

The sub-patterns 3A, 3B, and 3C are arranged on a reticle 20 in much the same way as sub-patterns 2A, 2B, and 2C. FIG. 7B schematically shows an arrangement of the sub-patterns 3A, 3B, and 3C on the reticle 20 according to the present invention. The reticle 20 has composite mask patterns 21 and 22 thereon. The composite mask pattern 21 consists of two sub-patterns 3A and two sub-patterns 3C which are each arranged adjacently relative to the y-axis. The sub-patterns 3A and 3C are disposed in the x-axis direction, respectively. The composite mask pattern 22 consists of two sub-patterns 3B arranged adjacently to one another in the y-axis direction. As is the case with the reticle 10, the reticle 20 has a pattern which is five times as large as the shield metal pattern 3. The reticle 20 includes overlap patterns 24A, 24B, and 24C which are formed adjacently to each of the sub-patterns 3A, 3B, and 3C, respectively, as is explained above. Each of the sub-patterns 3A, 3B, and 3C is isolated by scribe regions 23 defining scribe lines. A border region 25 surrounds the composite mask patterns 21 and 22.

As is explained above, it is also preferable that the composite mask patterns 21 and 22 are disposed as near to the center o of the reticle 20 as possible. Specifically, the distance between the center o and each of corner points tl, $t_2$, $t_3$, and $t_4$ is preferably substantially equal to each other. Each of the corner points $t_1$, $t_2$, $t_3$, and $t_4$ is defined as the point which is nearest to a respective corner of the reticle 20 in the composite mask patterns 21 and 22. By making the distance between the center o and each of corner points $t_1$, $t_2$, $t_3$, and $t_4$ equal to each other, the pattern consisting of the composite mask patterns 21 and 22 is disposed relatively symmetrically with respect to the center axes q and r. Thus, the scribe line 23 between the sub-patterns 3C and 3A is arranged at a different position of the reticle 20 from the position where the scribe line 13 is arranged on the reticle 10.

Hereinafter, a method for producing a semiconductor device using the reticles 10 and 20 of the present invention is explained. For exposing the semiconductor substrate 1 in combination with the reticles 10 and 20, a stepper is utilized. The stepper has an offset means for changing projection coordinates, blind means for shielding a part of the reticle, and step-and-repeat means for exposing a substrate in step-and-repeat fashion.

Figure 8A:
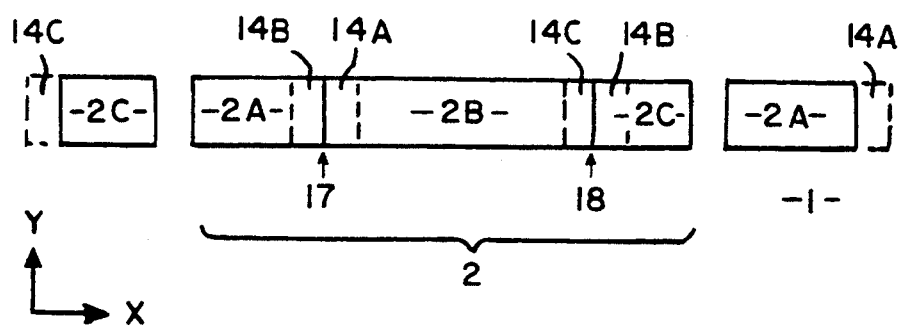
FIG. 8A is a schematic view of a channel stop pattern formed on a semiconductor substrate using the channel stop sub-patterns according to the present invention.

FIG. 8A schematically shows a channel stop pattern 2 formed on the semiconductor substrate 1. Referring to FIGS. 7A and 8A, the method of exposing the semiconductor substrate 1 using the reticles 10 and 20 and the stepper is now explained. The semiconductor substrate 1 is initially exposed using the reticle 10 whereby the composite mask pattern 12 is shielded from the radiation source using the blind means of the stepper, and the sub-patterns 2C and 2A are irradiated and thereby transferred on the semiconductor substrate 1.

Then, the projection coordinates are moved using the offset means, and the substrate 1 is exposed using the reticle 10 in which the composite mask pattern 11 is shielded, so that the sub-pattern 2B is formed between the sub-patterns 2A and 2C previously formed on the semiconductor substrate 1. The overlap patterns 14A and 14B overlap with parts of the sub-patterns 2B and 2A, respectively. A border 17 is formed between an edge of the sub-pattern 2A and an edge of the sub-pattern 2B. The border 17 is disposed at the position 5 shown in FIG. 6. The overlap patterns 14B and 14C also overlap with parts of the sub-pattern 2C and 2B, respectively. A border 18 is formed between the other edge of the sub-pattern 2B and an edge of the sub-pattern 2C. The border 18 is disposed at the position 6 shown in FIG. 6. As a result, the channel stop pattern 2 consisting of the sub-patterns 2A, 2B, and 2C is formed on the semiconductor substrate 1.

Figure 8B:
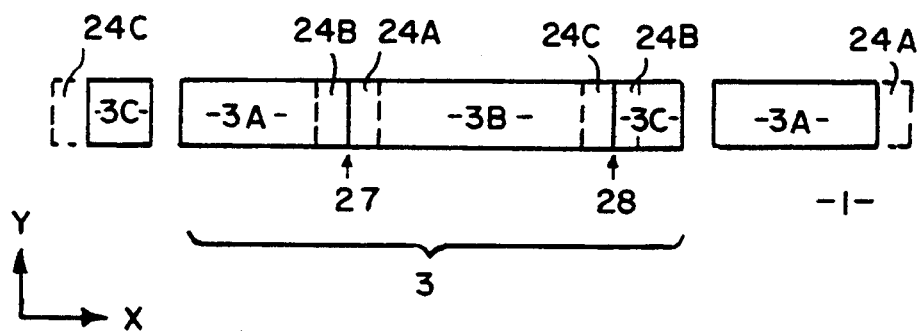
FIG. 8B is a schematic view of a shield metal pattern formed on a semiconductor substrate using the shield metal sub-patterns according to the present invention.

As is shown in FIG. 8B, the shield metal pattern 3 consisting of the sub-patterns 3A, 3B, and 3C is formed by the same method as is explained above. The shield metal pattern 3 has a border 27 between the sub-patterns 3A and 3B, and a border 28 between the sub-patterns 3B and 3C. The borders 27 and 28 are disposed at the positions 7 and 8 shown in FIG. 6, respectively.

Figure 9A:
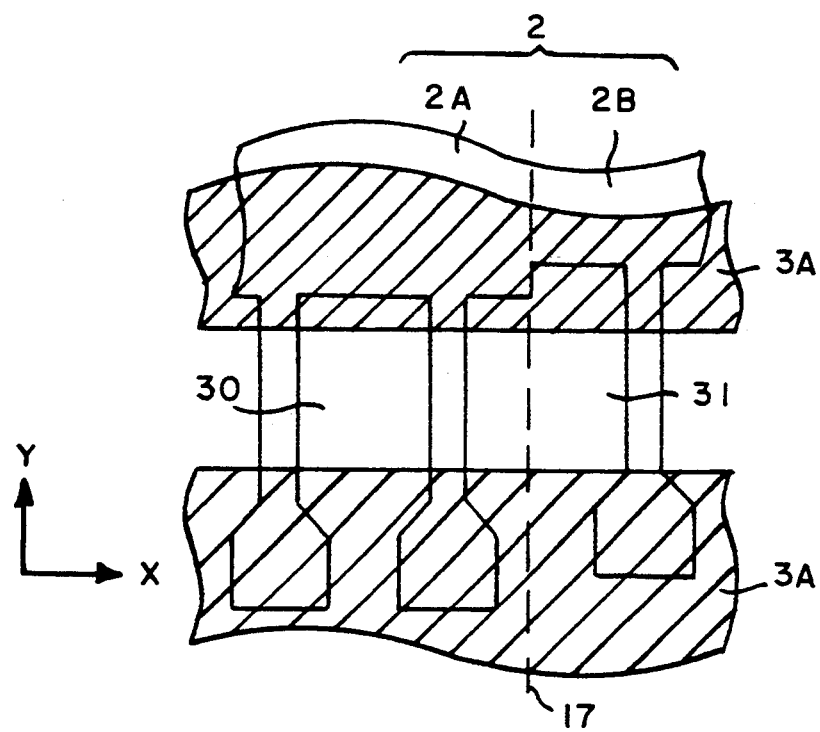
FIG. 9A represents an enlarged view of a channel stop pattern and a shield metal pattern formed on a semiconductor substrate of an actual device near a border according to the present invention.
Figure 9B:
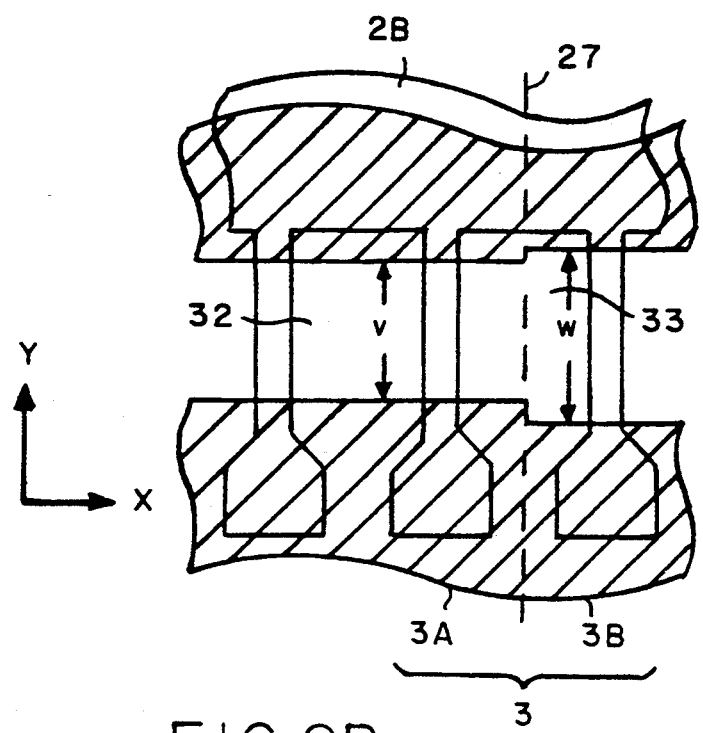
FIG. 9B represents an enlarged view of a channel stop pattern and a shield metal pattern formed on a semiconductor substrate of an actual device near another border according to the present invention.

FIGS. 9A and 9B show enlarged views near the borders 17 and 27. As is shown in FIG. 9A, because the transferring of the sub-patterns 2A and 2B needs different alignments of the stepper and the reticles 10 and 20 (shown in FIGS. 7A and 7B) relative to the semiconductor substrate 1, a relative misalignment of the sub-pattern 2B and the sub-pattern 2A can arise, and the sub-pattern 2B can be misaligned both with respect to the x-axis and y-axis relative to the sub-pattern 2A at the border 17. However, because the shield metal pattern 3 is formed on the semiconductor substrate 1 such that at the border 17 only the sub-pattern 3A is utilized, a misalignment of the shield metal pattern 3 will not arise at the border 17. Therefore, a light receiving portion 31 formed at the border 17 is affected only by the misalignment of the channel stop pattern 2.

On the other hand, as is shown in FIG. 9B, because transferring the sub-patterns 3A and 3B requires different alignments of the stepper and the reticles 10 and 20, a relative misalignment of the sub-pattern 3B against the sub-pattern 3A can arise, and the sub-pattern 3B can be misaligned in a y-axis direction relative to the sub-pattern 3A at the border 27. Also, a line width v of the sub-pattern 3A may be different from a width w of the sub-pattern 3B. However, because the channel stop pattern 2 is transferred at the border 27 using only the sub-pattern 2B, a misalignment of the channel stop pattern 2 will not arise at the border 27. Therefore, a light receiving portion 33 formed at the border 27 is affected only by the misalignment of the shield metal pattern 3.

Figure 1:
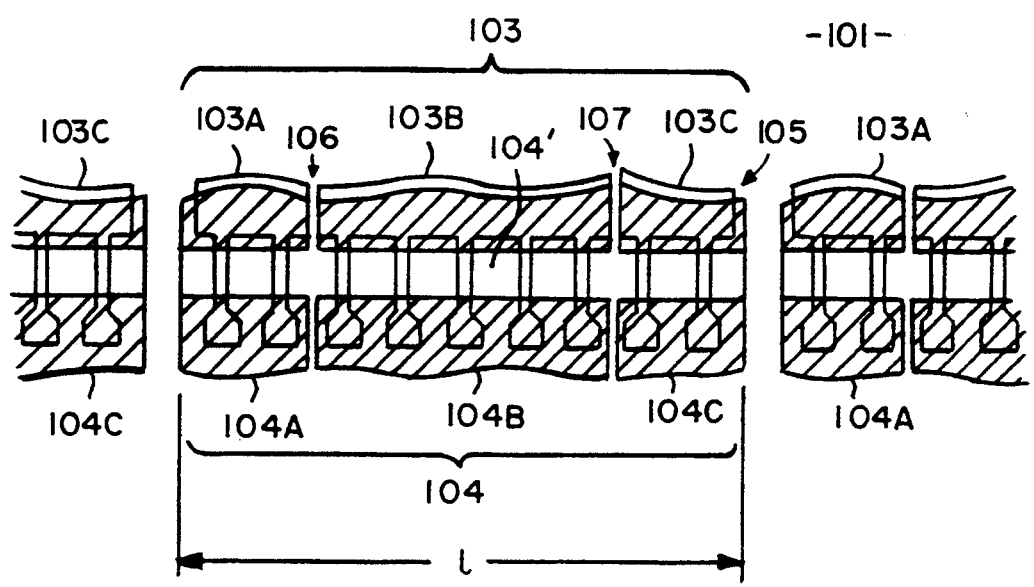
FIG. 1 schematically shows division of a channel stop pattern and a shield metal pattern into sub-patterns according to a conventional technique.
Figure 2:
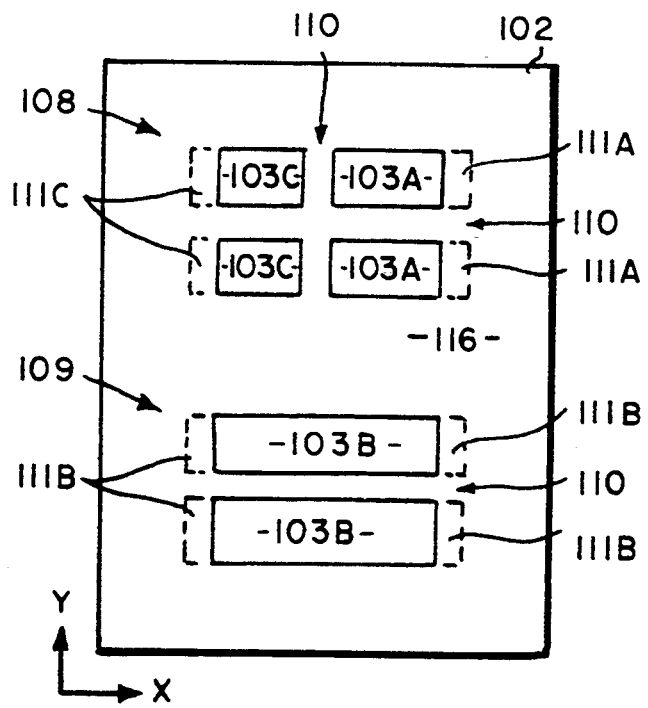
FIG. 2 is a plan view of a reticle having a channel stop patterns divided into sub-patterns according to the conventional technique.
Figure 3A:
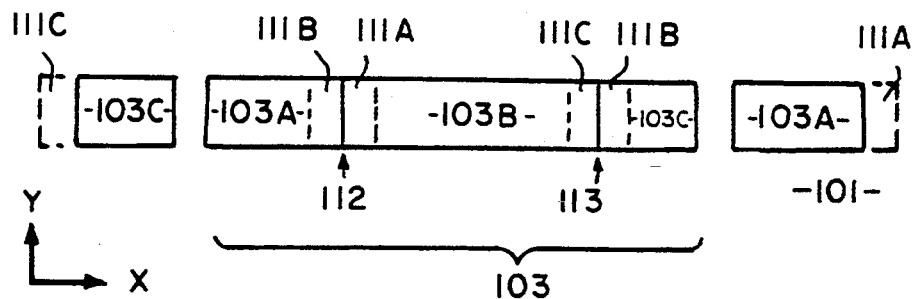
FIG. 3A is a schematic view of a channel stop pattern formed on a semiconductor substrate from the channel stop sub-patterns according to the conventional technique.
Figure 3B:
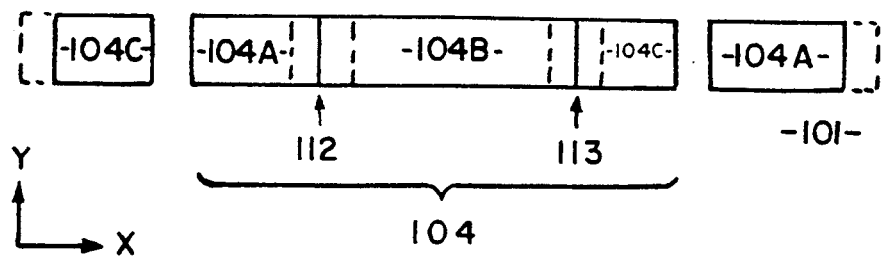
FIG. 3B is a schematic view of a shield metal pattern formed on a semiconductor substrate from the shield metal sub-patterns according to the conventional technique.
Figure 4:
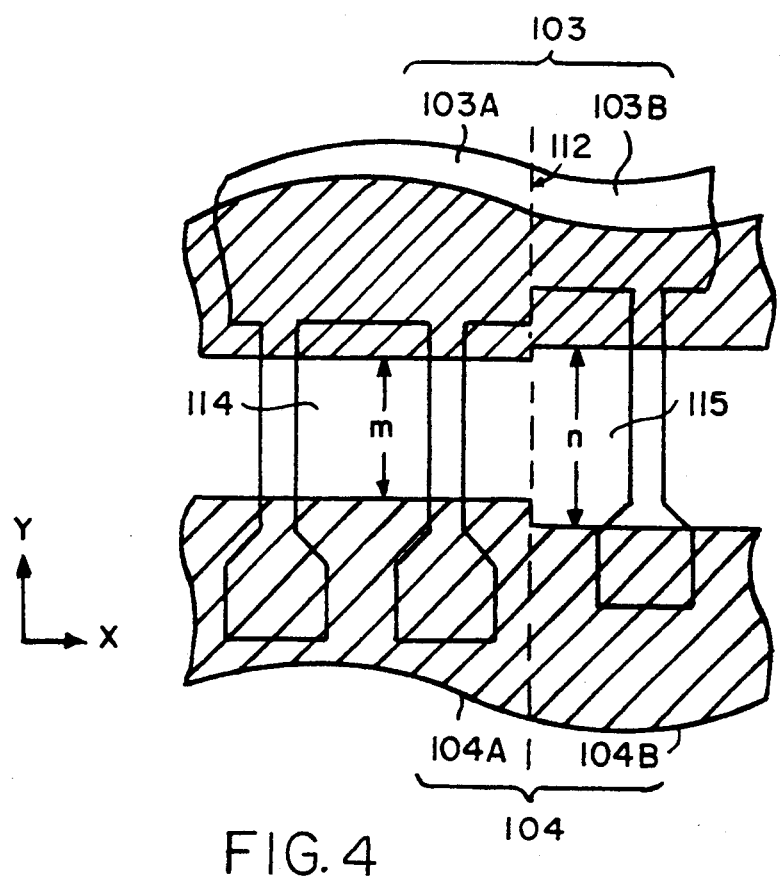
FIG. 4 represents an enlarged view of a channel stop pattern and a shield metal pattern formed on a semiconductor substrate of an actual device near a border according to the conventional technique.
Figure 5:
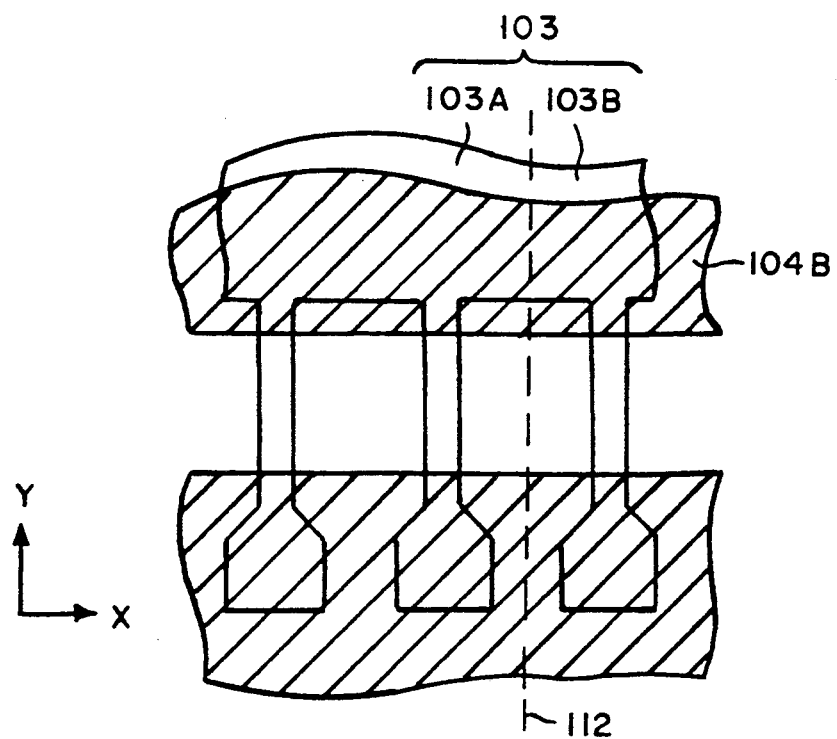
FIG. 5 is an enlarged view of a channel stop pattern and a shield metal pattern in an ideal device near a border.

As is explained above, because the shield metal pattern 3 is divided at a position which is different from the position where the channel stop pattern is divided, either the border (e.g., 17 or 18) of the channel stop pattern 2 or the border (e.g., 27 or 28) of the shield metal pattern 3 is positioned at a light receiving portion. An area of the light receiving portion is affected by misalignment caused in either the channel stop pattern or the shield metal pattern. Therefore, any non-uniformity of each area of the light receiving portion becomes more distributed, thereby increasing uniformity. According the conventional technique described above with respect to FIG. 5, the non-uniformity of the output sensitivity is in the range of 3 to 5%, while the present invention makes the non-uniformity of the output sensitivity within the range of 1%. This value is sufficient for practical use.

In the aforementioned example, each chip pattern, i.e., a channel stop pattern or a shield metal pattern, is divided at the position where the light receiving portion is located. However, the chip pattern may be divided at any position, and be divided into any number of sub-patterns. Moreover, the chip patterns of layers other than the channel stop pattern and shield metal pattern may be divided at different position from each other. For example, in the case where fabrication of a solid state imaging device consists of five layers, each chip pattern for forming each of five layers may be divided at different position relative to each other. Only particular chip patterns, that affects severely to the device characteristic if misalignment is arisen, may be divided at different position from each other.

In this example, one dimensional solid state imaging device is explained as the present invention. However, the present invention applies to any type of device having a pattern which is too large to form on a reticle continuously.

Various other modifications will be apparent to and can be readily made by those skilled in the art without departing from the scope of this invention. Accordingly, it is not intended that the scope of the claims appended hereto be limited to the description as set forth herein, but rather that the claims be broadly construed.

What is claimed is:

1. A method for producing a semiconductor device, comprising the steps of:
   exposing a substrate using a first photomask to form a first chip pattern on said substrate, said first chip pattern being divided into first sub-patterns at a first position on said first photomask so that said first sub-patterns are combined on said substrate and form said first chip pattern;
   exposing said substrate using a second photomask to form a second chip pattern at least partially overlapping said first chip pattern on said substrate, said second chip pattern being divided into second sub-patterns at a second position on said second photomask so that said second sub-patterns are combined on said substrate and form said second chip pattern; and
   Wherein said second position on said second photomask is different relative to said first position on said first photomask.

2. A method for producing a semiconductor device as recited in claim 1, wherein each of said first and second photomask has four corner points nearest to the respective corner thereof in respective one of said first and second sub-pattern, and each distance between each of said four corner points and the center of said respective photomask is substantially equal to each other.

3. A method for producing a semiconductor device having first and second chip patterns formed on a substrate, said method comprising the steps of:
   forming said first chip pattern on said substrate by sequentially forming a plurality of first sub-patterns making up said first chip pattern on said substrate, said first sub-patterns being joined together on said substrate at at least one first border;
   forming said second chip pattern overlapping said first chip pattern on said substrate by sequentially forming a plurality of second sub-patterns making up said second chip pattern on said substrate, said second sub-patterns being joined together on said substrate at at least one second border; and
   wherein a location of each of said at least one first border on said substrate is different than a location of each of said at least one second border on said substrate.

4. A method for producing a semiconductor device as recited in claim 3, wherein said first and second sub-patterns are formed on first and second photomasks, respectively, each of said first and second photomask has four corner points nearest to the respective corner thereof in respective one of said first and second sub-pattern, and each distance between each of said four corner points and the center of said respective photomask is substantially equal to each other.

5. A semiconductor device having first and second chip patterns formed on a substrate, said semiconductor device being produced according to the steps of:
   forming said first chip pattern on said first substrate by sequentially forming a plurality of first sub-patterns making up said first chip pattern on said substrate, said first sub-patterns being joined together on said substrate at at least one first border;
   forming said second chip pattern overlapping said first chip pattern on said substrate by sequentially forming a plurality of second sub-patterns making up said second chip pattern on said substrate, said second sub-patterns being joined together on said substrate at at least one second border; and
   wherein a location of each of said at least one first border on said substrate is different than a location of each of said at least one second border on said substrate.

6. A semiconductor device of claim 5, wherein said first and second sub-patterns are formed on first and second photomasks, respectively, each of said first and second photomask has four corner points nearest to the respective corner thereof in respective one of said first and second sub-pattern, and each distance between each of said four corner points and the center of said respective photomask is substantially equal to each other.

7. A semiconductor device of claim 6, said semiconductor device being a solid state imaging device.

8. A semiconductor device of claim 7, wherein said first chip pattern is a channel stop pattern and said second chip pattern is a shield metal pattern.

* * * * *